United States Patent
Li et al.

(10) Patent No.: US 10,559,242 B2
(45) Date of Patent: Feb. 11, 2020

(54) SHIFT REGISTER, DRIVING METHOD THEREOF, GATE LINE INTEGRATED DRIVING CIRCUIT AND DISPLAY DEVICE

(71) Applicants: Beijing BOE Optoelectronics Technology Co., Ltd., Beijing (CN); BOE Technology Group Co., Ltd., Beijing (CN)

(72) Inventors: Yan Li, Beijing (CN); Xiaobo Xie, Beijing (CN); Lingyun Shi, Beijing (CN); Wei Sun, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/091,128

(22) PCT Filed: Feb. 23, 2018

(86) PCT No.: PCT/CN2018/077049
§ 371 (c)(1),
(2) Date: Oct. 4, 2018

(87) PCT Pub. No.: WO2018/161806
PCT Pub. Date: Sep. 13, 2018

(65) Prior Publication Data
US 2019/0130806 A1  May 2, 2019

(30) Foreign Application Priority Data

Mar. 8, 2017  (CN) .......................... 2017 1 0135226

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01); *G09G 2310/06* (2013.01)

(58) Field of Classification Search
CPC ...... G09G 3/20; G09G 3/2092; G09G 3/3677; G09G 3/3674; G09G 2310/0286;
(Continued)

(56) References Cited

U.S. PATENT DOCUMENTS

| | | | | |
|---|---|---|---|---|
| 6,377,099 B1 * | 4/2002 | Cairns | ................. | G09G 3/3688 327/217 |
| 2001/0033254 A1 * | 10/2001 | Furusato | ............... | G06F 3/0414 345/55 |

(Continued)

FOREIGN PATENT DOCUMENTS

| CN | 1991960 A | 7/2007 |
|---|---|---|
| CN | 101055390 A | 10/2007 |

(Continued)

OTHER PUBLICATIONS

Chinese Office Action dated Oct. 19, 2018 for corresponding application CN 201710135226.6.

(Continued)

*Primary Examiner* — Christopher E Leiby
(74) *Attorney, Agent, or Firm* — Arent Fox LLP; Michael Fainberg

(57) ABSTRACT

A shift register comprises: a first generation circuit generating a first clock signal and providing the same to a shift register logic circuit; a second generation circuit generating a second clock signal and providing the same to the shift register logic circuit; and a first control signal terminal (EN1), a second control signal terminal (EN2), a third control signal terminal (EN3) and a fourth control signal terminal (EN4) providing controls to ensure that the first (Continued)

clock signal and the second clock signal are out of phase to each other, and the clock signals can have different frequencies at different time intervals.

12 Claims, 9 Drawing Sheets

(58) Field of Classification Search
CPC ......... G09G 2310/061; G09G 2310/06; G09G 2330/021; G11C 19/28
See application file for complete search history.

(56) References Cited

U.S. PATENT DOCUMENTS

| | | |
|---|---|---|
| 2004/0021625 A1 | 2/2004 | Lee |
| 2004/0041774 A1* | 3/2004 | Moon .................. G09G 3/3677 345/99 |
| 2005/0243051 A1 | 11/2005 | Kudo et al. |
| 2011/0150169 A1* | 6/2011 | Lin ........................ G11C 19/28 377/64 |
| 2014/0103983 A1* | 4/2014 | Chang .................. G09G 3/3655 327/198 |
| 2014/0159999 A1* | 6/2014 | Gu .......................... G11C 19/28 345/100 |
| 2015/0301415 A1* | 10/2015 | Sawada .................. G11C 19/28 349/147 |
| 2016/0372063 A1* | 12/2016 | Li .......................... G11C 19/28 |
| 2019/0005866 A1 | 1/2019 | Li et al. |

FOREIGN PATENT DOCUMENTS

| | | |
|---|---|---|
| CN | 106205461 A | 12/2016 |
| CN | 106251804 A | 12/2016 |
| CN | 106710561 A | 5/2017 |

OTHER PUBLICATIONS

International Search Report for PCT/CN2018/077049 dated Jun. 4, 2018.

* cited by examiner

SHIFT REGISTER, DRIVING METHOD THEREOF, GATE LINE INTEGRATED DRIVING CIRCUIT AND DISPLAY DEVICE

This application is a National Stage of International Application No. PCT/CN2018/077049, filed Feb. 23, 2018, which claims priority to Chinese Patent Application No. 201710135226.6, filed with the Chinese Patent Office on Mar. 8, 2017, and entitled "Shift register, method for driving the same, gate line integrated driver circuit, and display device", which is hereby incorporated by reference in its entirety.

FIELD

The disclosure relates to the field of display technologies, and particularly to a shift register, a method for driving the same, a gate line integrated driver circuit, and a display device.

BACKGROUND

As the sciences and technologies are developing rapidly nowadays, flat panel displays have been widely applied to electronic display products, e.g., a TV set, a computer, a mobile phone, a personal digital assistant, etc. A flat panel display includes a data driver (Source Driver), a gate driver, a display panel, etc. The display panel includes an array of pixels, and the gate driver is configured to turn on respective rows of pixels in the array of pixels successively so that pixel data output by the data driver is transmitted to the pixels to thereby display an image to be displayed.

At present, the gate driver is typically formed on an array substrate of the display by an array process, i.e., a Gate Driver on Array (GOA) process, and this integrated process can save a cost, but also can make the display panel fabricated in a specious design with two symmetric sides; and a bonding area of an gate Integrated Circuit (IC), and a fan-out wiring space can be dispensed with for the design of a narrow bezel. Furthermore this integrated process can have a bonding process in the direction of gate scan lines dispensed with to thereby improve the production throughput and the good yield.

However an image typically can only be displayed at one resolution in a time period of one frame in the traditional GOA design.

SUMMARY

An embodiment of the disclosure provides a shift register. The shift register includes a shift register logic circuit, a first generation circuit, and a second generation circuit, wherein the first generation circuit has a first terminal connected with a first control signal terminal, a second terminal connected with a second control signal terminal, a third terminal connected with a third control signal terminal, a fourth terminal connected with a fourth control signal terminal, a fifth terminal connected with a low-level signal terminal, a sixth terminal connected with a high-level signal terminal, a seventh terminal connected with a first input signal terminal, an eighth terminal connected with a second input signal terminal, a ninth terminal connected with a third input signal terminal, and a tenth terminal, which is an output terminal, connected with a first clock signal input terminal of the shift register logic circuit; and the first generation circuit is configured to generate and output a first clock signal under the control of the first control signal terminal, the second control signal terminal, the third control signal terminal, and the fourth control signal terminal; the second generation circuit has a first terminal connected with the first control signal terminal, a second terminal connected with the second control signal terminal, a third terminal connected with the third control signal terminal, a fourth terminal connected with the fourth control signal terminal, a fifth terminal connected with the low-level signal terminal, a sixth terminal connected with the high-level signal terminal, a seventh terminal connected with the second input signal terminal, an eighth terminal connected with the third input signal terminal, a ninth terminal connected with a fourth input signal terminal, and a tenth terminal, which is an output terminal, connected with a second clock signal input terminal of the shift register logic circuit; and the second generation circuit is configured to generate and output a second clock signal under the control of the first control signal terminal, the second control signal terminal, the third control signal terminal, and the fourth control signal terminal; and the first clock signal and the second clock signal are clock signals with opposite phases, and the clock signals are configured to be provided with different frequencies in different time periods.

In a possible implementation, in the shift register above according to the embodiment of the disclosure, the first generation circuit includes: a first switch transistor, a second switch transistor, a third switch transistor, a fourth switch transistor, a fifth switch transistor, a sixth switch transistor, and a seventh switch transistor, wherein the first switch transistor has a gate connected with the first control signal terminal, a source connected with the high-level signal terminal, and a drain connected with a gate of the fifth switch transistor; the second switch transistor has a gate connected with the second control signal terminal, a source connected with the high-level signal terminal, and a drain connected with the gate of the fifth switch transistor; the third switch transistor has a gate connected with the third control signal terminal, a source connected with the low-level signal terminal, and a drain connected with the gate of the fifth switch transistor; the fourth switch transistor has a gate connected with the fourth control signal terminal, a source connected with the low-level signal terminal, and a drain connected with the gate of the fifth switch transistor; the fifth switch transistor has a source connected with the first input signal terminal, and a drain connected with the first clock signal input terminal of the shift register logic circuit; the sixth switch transistor has a gate connected with the third control signal terminal, a source connected with the second input signal terminal, and a drain connected with the first clock signal input terminal of the shift register logic circuit; and the seventh switch transistor has a gate connected with the fourth control signal terminal, a source connected with the third input signal terminal, and a drain connected with the first clock signal input terminal of the shift register logic circuit.

In a possible implementation, in the shift register above according to the embodiment of the disclosure, the second generation circuit includes: an eighth switch transistor, a ninth switch transistor, a tenth switch transistor, an eleventh switch transistor, a twelfth switch transistor, a thirteenth switch transistor, and a fourteenth switch transistor, wherein the eighth switch transistor has a gate connected with the first control signal terminal, a source connected with the high-level signal terminal, and a drain connected with a gate of the twelfth switch transistor; the ninth switch transistor has a gate connected with the second control signal terminal, a source connected with the high-level signal terminal, and a drain connected with the gate of the twelfth switch transistor; the tenth switch transistor has a gate connected with the third control signal terminal, a source connected with the low-level signal terminal, and a drain connected with the gate of the twelfth switch transistor; the eleventh switch transistor has a gate connected with the fourth control signal terminal, a source connected with the low-level signal terminal, and a drain connected with the gate of the twelfth switch transistor; the twelfth switch transistor has a source connected with the fourth input signal terminal, and a drain connected with the second clock signal input terminal of the shift register logic circuit; the thirteenth switch transistor has a gate connected with the third control signal terminal, a source connected with the third input signal terminal, and a drain connected with the second clock signal input terminal of the shift register logic circuit; and the fourteenth switch transistor has a gate connected with the fourth control signal terminal, a source connected with the second input signal terminal, and a drain connected with the second clock signal input terminal of the shift register logic circuit.

In a possible implementation, in the shift register above according to the embodiment of the disclosure, the shift register logic circuit includes: an input circuit, a pull-down drive circuit, an output circuit, a pull-down circuit, and a reset circuit, wherein the input circuit has a first terminal connected with a signal input terminal, a second terminal connected with a first level signal terminal, and a third terminal connected with a first node; and the input circuit is configured to control a potential of the first node under the control of the signal input terminal; the pull-down driver circuit has a first terminal, which is the first clock signal input terminal of the shift register logic circuit, connected with the tenth terminal of the first generation circuit, a second terminal connected with the first node, a third terminal connected with the low-level signal terminal, a fourth terminal connected with a second node, and a fifth terminal connected with a signal output terminal; and the pull-down driver circuit is configured to control a potential of the second node under the control of the first clock signal input terminal, the first node, and the signal output terminal; the output circuit has a first terminal, which is the second clock signal input terminal of the shift register logic circuit, connected with the tenth terminal of the second generation circuit, a second terminal connected with the first node, and a third terminal connected with the signal output terminal; and the output circuit is configured to output the second clock signal through the signal output terminal under the control of the first node; the pull-down circuit has a first terminal connected with the low-level signal terminal, a second terminal connected with the first node, a third terminal connected with the second node, and a fourth terminal connected with the signal output terminal; and the pull-down circuit is configured to control the potentials of the first node and the signal output terminal under the control of the second node; and the reset circuit has a first terminal connected with the first node, a second terminal connected with a second level signal terminal, and a third terminal connected with a reset signal terminal; and the reset circuit is configured to control the potential of the first node under the control of the reset signal terminal.

In a possible implementation, in the shift register above according to the embodiment of the disclosure, the pull-down driver circuit includes: a fifteenth switch transistor, a sixteenth switch transistor, and a seventeenth switch transistor, wherein the fifteenth switch transistor has a gate and a source connected respectively with the tenth terminal of the first generation circuit, and a drain connected with the second node; the sixteenth switch transistor has a gate connected with the first node, a source connected with the low-level signal terminal, and a drain connected with the second node; and the seventeenth switch transistor has a gate connected with the signal output terminal, a source connected with the low-level signal terminal, and a drain connected with the second node.

In a possible implementation, in the shift register above according to the embodiment of the disclosure, the output circuit includes: an eighteenth switch transistor and a first capacitor, wherein the eighteenth switch transistor has a gate connected with the first node, a source connected with the tenth terminal of the second generation circuit, and a drain connected with the signal output terminal; and the first capacitor is connected between the first node and the signal output terminal.

In a possible implementation, in the shift register above according to the embodiment of the disclosure, the input circuit includes a nineteenth switch transistor, wherein the nineteenth switch transistor has a gate connected with the signal input terminal, a source connected with the first level signal terminal, and a drain connected with the first node.

In a possible implementation, in the shift register above according to the embodiment of the disclosure, the pull-down circuit includes: a twentieth switch transistor, a twenty-first switch transistor, and a second capacitor, wherein the twentieth switch transistor has a gate connected with the second node, a source connected with the low-level signal terminal, and a drain connected with the first node; the twenty-first switch transistor has a gate connected with the second node, a source connected with the low-level signal terminal, and a drain connected with the signal output terminal; and the second capacitor is connected between the second node and the low-level signal terminal.

In a possible implementation, in the shift register above according to the embodiment of the disclosure, the reset circuit includes a twenty-second switch transistor, wherein the twenty-second switch transistor has a gate connected with the reset signal terminal, a source connected with the second level signal terminal, and a drain connected with the first node.

In another aspect, an embodiment of the disclosure further provides a method for driving the shift register above. The method includes providing the first input signal terminal and the fourth input signal terminal with clock signals with opposite phases, and providing the second input signal terminal and the third input signal terminal with clock signals with opposite phases, wherein the clock signal provided to the second input signal terminal is offset from the clock signal provided to the first input signal terminal by a half of a periodicity, and the clock signal provided to the third input signal terminal is offset from the clock signal provided to the fourth input signal terminal by a half of the periodicity; in a time period at a first resolution, providing the first control signal terminal and the second control signal terminal with control clock signals with opposite phases, and providing the third control signal terminal and the fourth control signal terminal with OFF level signals; and in a time period at a second resolution, providing the third control signal terminal and the fourth control signal terminal with control clock signals with opposite phases, and providing the first control signal terminal and the second control signal terminal with OFF level signals, wherein the control clock signals have the same periodicity as the clock signal of the first input signal terminal; and the second resolution is twice the first resolution.

In another aspect, an embodiment of the disclosure further provides a gate line integrated driver circuit including a plurality of cascaded shift registers according to any one of the embodiments above of the disclosure, wherein each of the shift registers other than a first shift register and a last shift register inputs a trigger signal to the signal input terminal of a succeeding shift register adjacent thereto, and inputs a reset signal to the reset signal terminal of a preceding shift register adjacent thereto; the first shift register inputs a trigger signal to the signal input terminal of the second shift register; and the last shift register inputs a reset signal to the reset signal terminals of itself and the preceding shift register.

In another aspect, an embodiment of the disclosure further provides a display device including the gate line integrated driver circuit above according to some embodiments of the disclosure.

DETAILED DESCRIPTION

Implementations of a shift register, a method for driving the same, a gate line integrated driver circuit, and a display device according to some embodiments of the disclosure will be described below in details with reference to the drawings.

Figure 1:
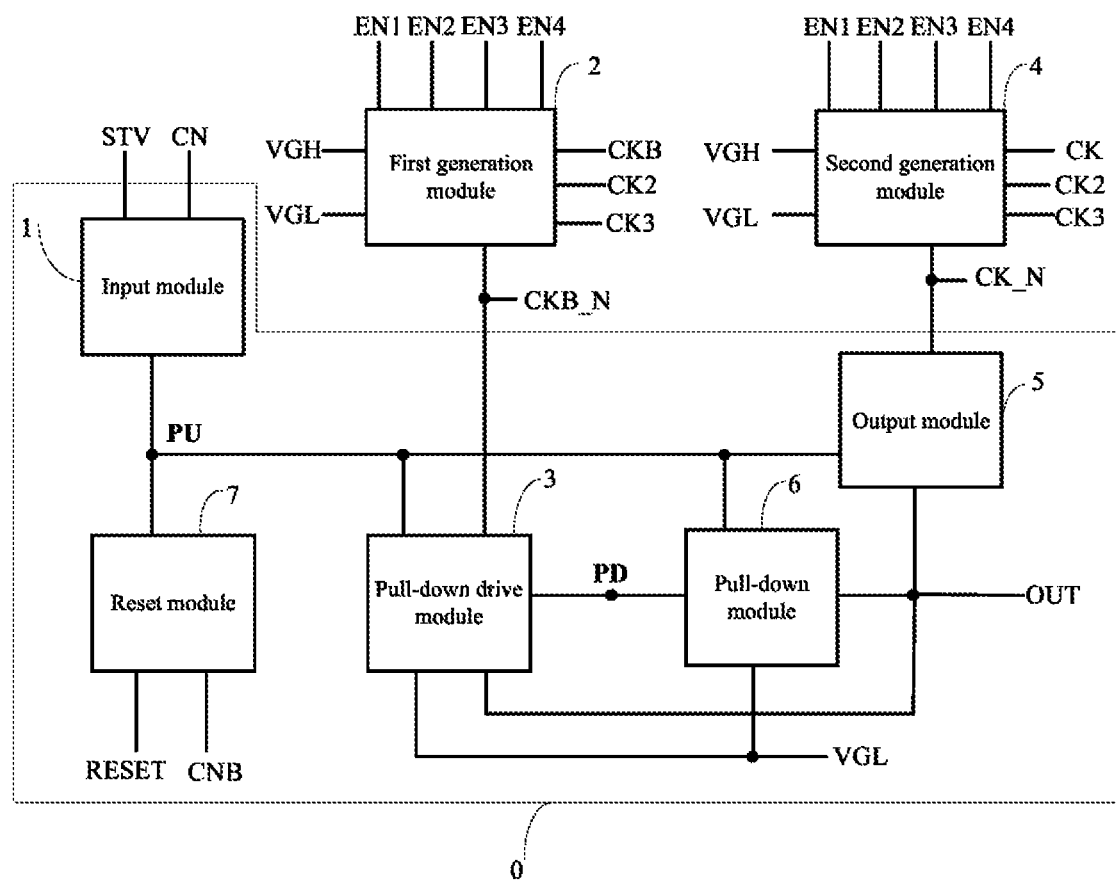
FIG. 1 is a schematic structural diagram of a shift register according to some embodiments of the disclosure.

As illustrated in FIG. 1, an embodiment of the disclosure provides a shift register. The shift register includes a shift register logic circuit 0, a first generation circuit 2, and a second generation circuit 4.

The first generation circuit 2 has a first terminal connected with a first control signal terminal EN1, a second terminal connected with a second control signal terminal EN2, a third terminal connected with a third control signal terminal EN3, a fourth terminal connected with a fourth control signal terminal EN4, a fifth terminal connected with a low-level signal terminal VGL, a sixth terminal connected with a high-level signal terminal VGH, a seventh terminal connected with a first input signal terminal CKB, an eighth terminal connected with a second input signal terminal CK2, a ninth terminal connected with a third input signal terminal CK3, and a tenth terminal which is an output terminal connected with a first clock signal input terminal CKB_N of shift register logic circuit 0. The first generation circuit 2 is configured to generate and output a first clock signal under the control of the first control signal terminal EN1, the second control signal terminal EN2, the third control signal terminal EN3, and the fourth control signal terminal EN4.

The second generation circuit 4 has a first terminal connected with the first control signal terminal EN1, a second terminal connected with the second control signal terminal EN2, a third terminal connected with the third control signal terminal EN3, a fourth terminal connected with the fourth control signal terminal EN4, a fifth terminal connected with the low-level signal terminal VGL, a sixth terminal connected with the high-level signal terminal VGH, a seventh terminal connected with the second input signal terminal CK2, an eighth terminal connected with the third input signal terminal CK3, a ninth terminal connected with a fourth input signal terminal CK, and a tenth terminal which is an output terminal connected with a second clock signal input terminal CK_N of the shift register logic circuit 0. The second generation circuit 4 is configured to generate and output a second clock signal under the control of the first control signal terminal EN1, the second control signal terminal EN2, the third control signal terminal EN3, and the fourth control signal terminal EN4.

The first clock signal and the second clock signal are clock signals with opposite phases, and the clock signals are configured to be provided with different frequencies in different time periods.

Specifically in the shift register above according to the embodiment of the disclosure, the first generation circuit 2 generates and provides the first clock signal to the shift register logic circuit 0; the second generation circuit 4 generates and provides the second clock signal to the shift register logic circuit 0. Under the control of the first control signal terminal EN1, the second control signal terminal EN2, the third control signal terminal EN3, and the fourth control signal terminal EN4, the first clock signal and the second clock signal are clock signals with opposite phases, and the clock signals are provided with different frequencies in different time periods. While an image is being displayed on a display panel, the first generation circuit 2 and the second generation circuit 4 generates the clock signals with the different frequencies, so that the clock signals with the different frequencies can be switched at any time, and thus the display panel is switched between different resolutions at any time, enabling an intelligent display function. The display panel can be switched at will between high-definition display and low-power-consumption modes to thereby satisfy a visual demand, and lower effectively power consumption.

Optionally in the shift register above according to some embodiments of the disclosure, as illustrated in FIG. 1, the shift register logic circuit 0 includes: an input circuit 1, a pull-down drive circuit 3, an output circuit 5, a pull-down circuit 6, and a reset circuit 7.

The input circuit 1 has a first terminal connected with a signal input terminal STV, a second terminal connected with a first level signal terminal CN, and a third terminal connected with a first node PU. The input circuit 1 is configured to control the potential of the first node PU under the control of the signal input terminal STV.

The pull-down driver circuit 3 has a first terminal which is the first clock signal input terminal CKB_N of the shift register logic circuit 0, connected with the tenth terminal of the first generation circuit 2, a second terminal connected with the first node PU, a third terminal connected with the low-level signal terminal VGL, a fourth terminal connected with a second node PD, and a fifth terminal connected with a signal output terminal OUT. The pull-down driver circuit 3 is configured to control the potential of the second node PD under the control of the first clock signal input terminal CKB_N, the first node PU, and the signal output terminal OUT.

The output terminal 5 has a first terminal which is a second clock signal input terminal CK_N of the shift register logic circuit 0, connected with the tenth terminal of the second generation circuit 2, a second terminal connected with the first node PU, and a third terminal connected with the signal output terminal OUT. The output circuit 5 is configured to output the second clock signal through the signal output terminal under the control of the first node PU.

The pull-down circuit 6 has a first terminal connected with the low-level signal terminal VGL, a second terminal connected with the first node PU, a third terminal connected with the second node PD, and a fourth terminal connected with the signal output terminal OUT. The pull-down circuit 6 is configured to control the potential of the first node PU and the potential of the signal output terminal OUT under the control of the second node PD.

The reset circuit 7 has a first terminal connected with the first node PU, a second terminal connected with a second level signal terminal CNB, and a third terminal connected with a reset signal terminal RESET. The reset circuit 7 is configured to control the potential of the first node PU under the control of the reset signal terminal RESET.

Specifically the five circuits above operates in cooperation to perform the function of outputting the second clock signal of the tenth terminal of the second generation circuit 4 through the signal output terminal OUT, and the frequency of the output signal is the same as the frequency of the second clock signal, so the display panel is switched between different resolutions at any time as the clock signals at the different frequencies are being switched, thus enabling an intelligent display function. The display panel can be switched between high-definition display and low-power-consumption modes at will to thereby satisfy a visual demand, and lower effectively power consumption.

The structure of the shift register logic circuit 0 in the shift register has only been described above by way of an example, and optionally the structure of the shift register logic circuit 0 will not be limited to the structure above according to the embodiment of the disclosure, but can alternatively be another structure known to those skilled in the art, although the embodiment of the disclosure will not be limited thereto.

The disclosure will be described below in details in connection with embodiments thereof. It shall be noted that these embodiments are intended to better illustrate the disclosure, but not intended to limit the disclosure thereto.

Figure 2:
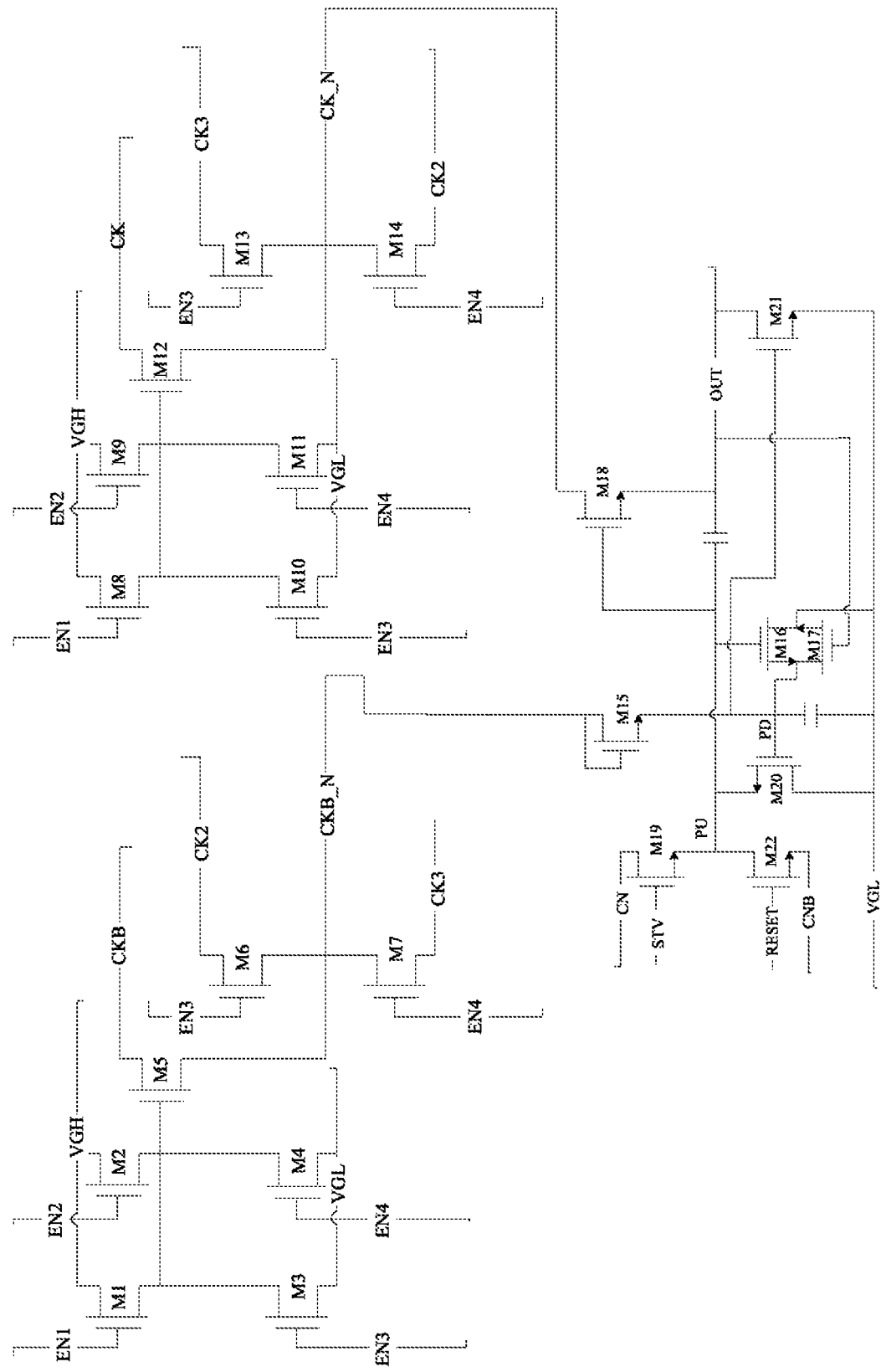
FIG. 2 is a schematic diagram of a structure of the shift register according to some embodiments of the disclosure.
Figure 3:
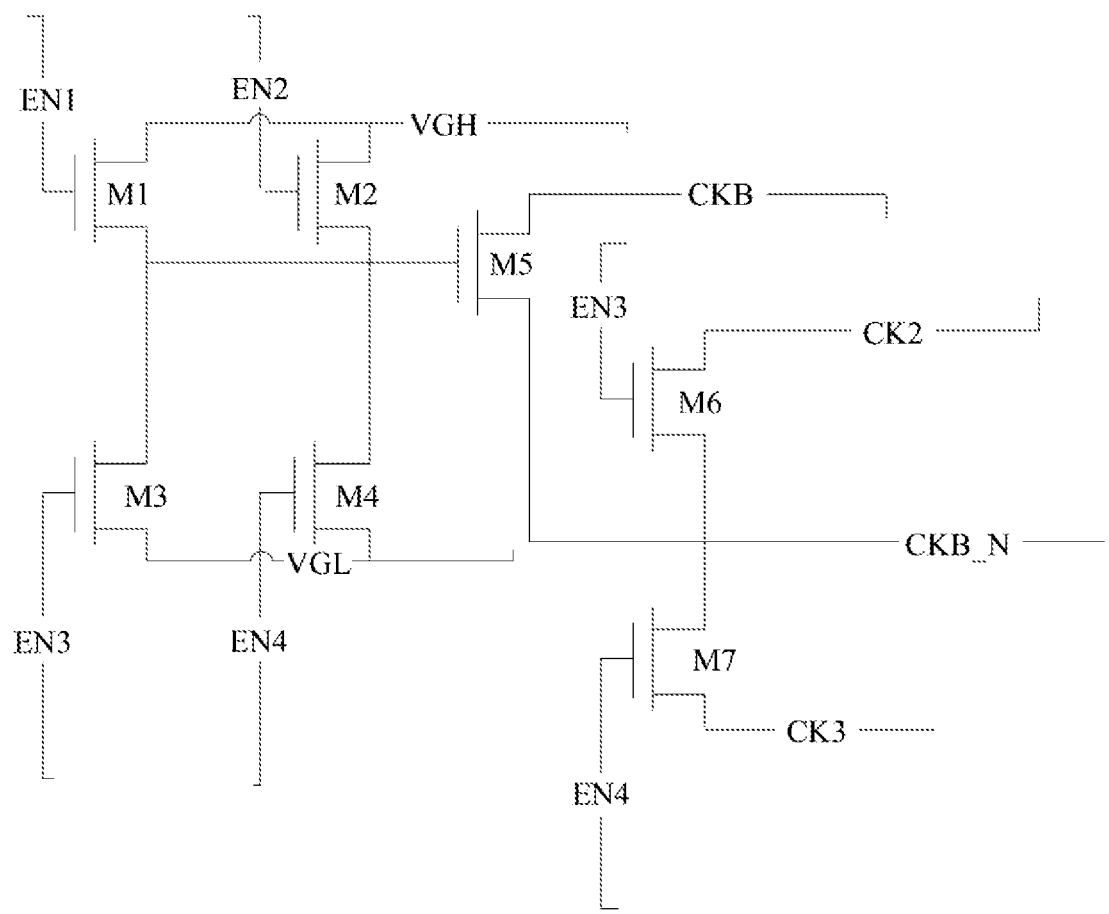
FIG. 3 is a schematic diagram of a structure of a first generation circuit according to some embodiments of the disclosure.

Optionally in the shift register above according to some embodiments of the disclosure, as illustrated in FIG. 2 and FIG. 3, the first generation circuit 2 includes: a first switch transistor M1, a second switch transistor M2, a third switch transistor M3, a fourth switch transistor M4, a fifth switch transistor M5, a sixth switch transistor M6, and a seventh switch transistor M7.

The first switch transistor M1 has a gate connected with the first control signal terminal EN1, a source connected with the high-level signal terminal VGH, and a drain connected with a gate of the fifth switch transistor M5.

The second switch transistor M2 has a gate connected with the second control signal terminal EN2, a source connected with the high-level signal terminal VGH, and a drain connected with the gate of the fifth switch transistor M5.

The third switch transistor M3 has a gate connected with the third control signal terminal EN3, a source connected with the low-level signal terminal VGL, and a drain connected with the gate of the fifth switch transistor M5.

The fourth switch transistor M4 has a gate connected with the fourth control signal terminal EN4, a source connected with the low-level signal terminal VGL, and a drain connected with the gate of the fifth switch transistor M5.

The fifth switch transistor M5 has a source connected with the first input signal terminal CKB, and a drain connected with the first clock signal input terminal CKB_N of the shift register logic circuit 0.

The sixth switch transistor M6 has a gate connected with the third control signal terminal EN3, a source connected with the second input signal terminal CK2, and a drain connected with the first clock signal input terminal CKB_N of the shift register logic circuit 0.

The seventh switch transistor M7 has a gate connected with the fourth control signal terminal EN4, a source connected with the third input signal terminal CK3, and a drain connected with the first clock signal input terminal CKB_N of the shift register logic circuit 0.

Specifically all of the first switch transistor M1, the second switch transistor M2, the third switch transistor M3, the fourth switch transistor M4, the fifth switch transistor M5, the sixth switch transistor M6, and the seventh switch transistor M7 are N-type switch transistors, or are P-type switch transistors, although the embodiment of the disclosure will not be limited thereto. The first switch transistor M1, the second switch transistor M2, the third switch transistor M3, the fourth switch transistor M4, the fifth switch transistor M5, the sixth switch transistor M6, and the seventh switch transistor M7 will be N-type switch transistors as described below by way of an example.

Specifically in a time period at a first resolution, that is, during operation at a lower resolution, the first control signal terminal EN1 and the second control signal terminal EN2 are provided with control clock signals with opposite phases, and the third control signal terminal EN3 and the fourth control signal terminal EN4 are provided with OFF level signals, i.e., low-level signals. Since the third control signal terminal EN3 and the fourth control signal terminal EN4 are at a low level, all of the third switch transistor M3, the fourth switch transistor M4, the sixth switch transistor M6, and the seventh switch transistor M7 are turned off. The first switch transistor M1 and the second switch transistor M2 are turned on alternately under the alternate control of the first control signal terminal EN1 and the second control signal terminal EN2, and at this time, the high-level signal terminal VGH transmits the signal to the gate of the fifth switch transistor M5 through the first switch transistor M1 or the second switch transistor M2 to thereby control the fifth switch transistor M5 to be turned on; and at this time, the signal input at the first input signal terminal CKB is output normally through the fifth switch transistor M5, that is, the generated first clock signal is the signal input at the first input signal terminal CKB.

In a time period at a second resolution, that is, during operation at a higher resolution (high-definition display), the third control signal terminal EN3 and the fourth control signal terminal EN4 are provided with control clock signals with opposite phases, and the first control signal terminal EN1 and the second control signal terminal EN2 are provided with OFF level signals, i.e., low-level signals. Since the first control signal terminal EN1 and the second control signal terminal EN2 are at a low level, both the first switch transistor M1 and the second switch transistor M2 are turned off. The third switch transistor M3 and the fourth switch transistor M4 are turned on alternately under the alternate control of the third control signal terminal EN3 and the fourth control signal terminal EN4, and at this time, the low-level signal terminal VGL can transmit the signal to the gate of the fifth switch transistor M5 through the third switch transistor M3 or the fourth switch transistor M4 to thereby control the fifth switch transistor M5 to be turned off. Also the sixth switch transistor M6 and the seventh switch transistor M7 are turned on alternately under the alternate control of the third control signal terminal EN3 and the fourth control signal terminal EN4, and at this time, the second input signal terminal CK2 can output a signal normally through the sixth switch transistor M6, that is, the generated first clock signal is the signal input at the second input signal terminal CK2, or the third input signal terminal CK3 can output a signal normally through the seventh switch transistor M7, that is, the generated first clock signal is the signal input at the third input signal terminal CK3. Furthermore since the clock signal of the second input signal terminal CK2 is opposite in phase to the clock signal of the third input signal terminal CK3, and their phases are offset from the control clock signals by a half of a periodicity, the periodicity of the generated first clock signal is a half of the periodicity of the input signals of the second input signal terminal CK2 and the third input signal terminal CK3, i.e., the frequency of the former is doubled.

The structure of the first generation circuit 2 in the shift register has only been described above by way of an example, and optionally the structure of the first generation circuit 2 will not be limited to the structure above according to the embodiment of the disclosure, but can alternatively be another structure known to those skilled in the art, although the embodiment of the disclosure will not be limited thereto.

Figure 4:
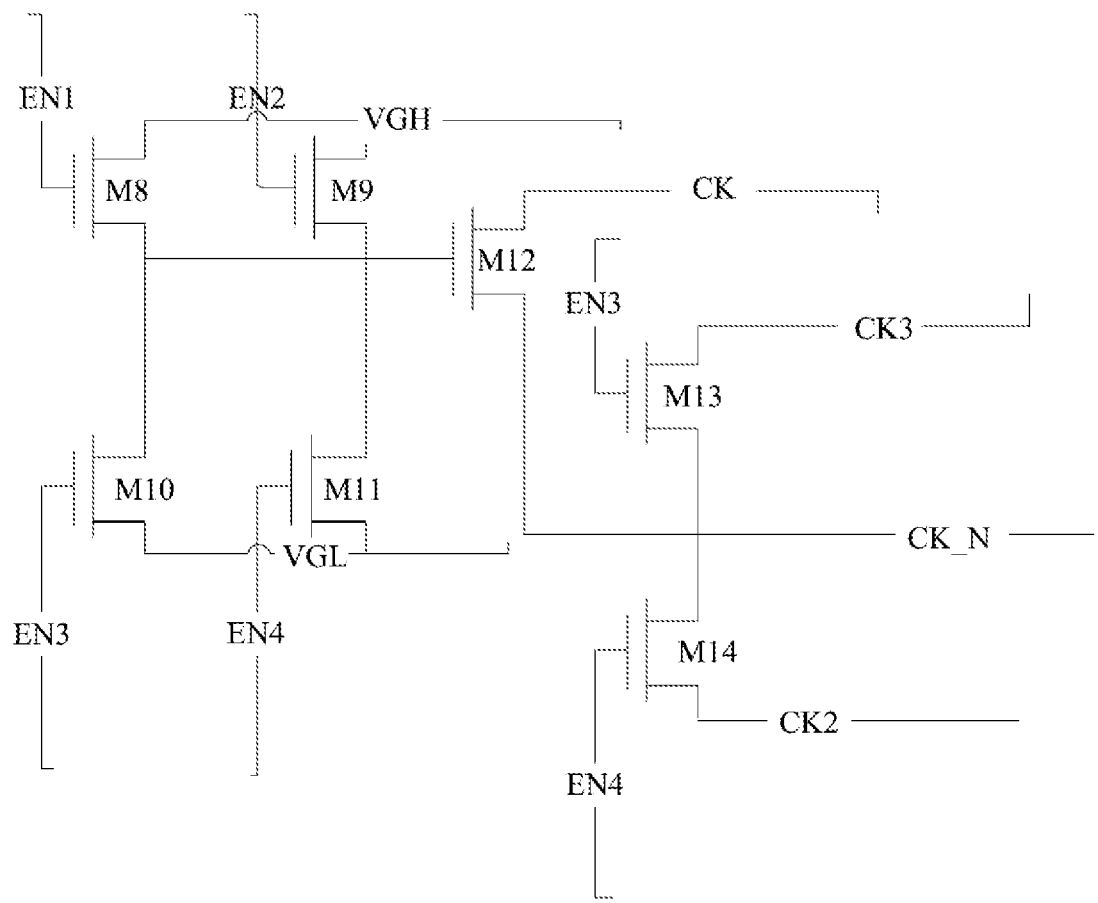
FIG. 4 is a schematic diagram of a structure of a second generation circuit according to some embodiments of the disclosure.

Optionally in the shift register above according to some embodiments of the disclosure, as illustrated in FIG. 2 and FIG. 4, the second generation circuit 4 includes: an eighth switch transistor M8, a ninth switch transistor M9, a tenth switch transistor M10, an eleventh switch transistor M11, a twelfth switch transistor M12, a thirteenth switch transistor M13, and a fourteenth switch transistor M14.

The eighth switch transistor M8 has a gate connected with the first control signal terminal EN1, a source connected with the high-level signal terminal VGH, and a drain connected with a gate of the twelfth switch transistor M12.

The ninth switch transistor M9 has a gate connected with the second control signal terminal EN2, a source connected with the high-level signal terminal VGH, and a drain connected with the gate of the twelfth switch transistor M12.

The tenth switch transistor M10 has a gate connected with the third control signal terminal EN3, a source connected with the low-level signal terminal VGL, and a drain connected with the gate of the twelfth switch transistor M12.

The eleventh switch transistor M11 has a gate connected with the fourth control signal terminal EN4, a source connected with the low-level signal terminal VGL, and a drain connected with the gate of the twelfth switch transistor M12.

The twelfth switch transistor M12 has a source connected with the fourth input signal terminal CK, and a drain connected with the second clock signal input terminal CK_N of the shift register logic circuit 0.

The thirteenth switch transistor M13 has a gate connected with the third control signal terminal EN3, a source connected with the third input signal terminal CK3, and a drain connected with the second clock signal input terminal CK_N of the shift register logic circuit 0.

The fourteenth switch transistor M14 has a gate connected with the fourth control signal terminal EN4, a source connected with the second input signal terminal CK2, and a drain connected with the second clock signal input terminal CK_N of the shift register logic circuit 0.

Specifically all of the eighth switch transistor M8, the ninth switch transistor M9, the tenth switch transistor M10, the eleventh switch transistor M11, the twelfth switch transistor M12, the thirteenth switch transistor M13, and the fourteenth switch transistor M14 can be N-type switch transistors, or can be P-type switch transistors, although the embodiment of the disclosure will not be limited thereto. All of the eighth switch transistor M8, the ninth switch transistor M9, the tenth switch transistor M10, the eleventh switch transistor M11, the twelfth switch transistor M12, the thirteenth switch transistor M13, and the fourteenth switch transistor M14 will be N-type switch transistors as described below by way of an example.

Specifically in a time period at a first resolution, i.e., during operation at a lower frequency, the first control signal terminal EN1 and the second control signal terminal EN2 are provided with control clock signals with opposite phases, and the third control signal terminal EN3 and the fourth control signal terminal EN4 are provided with OFF level signals, i.e., low-level signals. Since the third control signal terminal EN3 and the fourth control signal terminal EN4 are at a low level, all of the tenth switch transistor M10, the eleventh switch transistor M11, the thirteenth switch transistor M13, and the fourteenth switch transistor M14 are turned off. The eighth switch transistor M8 and the ninth switch transistor M9 are turned on alternately under the alternate control of the first control signal terminal EN1 and the second control signal terminal EN2, and at this time, the high-level signal terminal VGH can transmit the signal to the gate of the twelfth switch transistor M12 through the eighth switch transistor M8 or the ninth switch transistor M9 to thereby control the twelfth switch transistor M12 to be turned on; and at this time, the signal input at the fourth input signal terminal CK is output normally through the twelfth switch transistor M12, that is, the generated second clock signal is the signal input at the fourth input signal terminal CK.

In a time period at a second resolution, that is, during operation at a higher resolution (high-definition display), the third control signal terminal EN3 and the fourth control signal terminal EN4 are provided with control clock signals with opposite phases, and the first control signal terminal EN1 and the second control signal terminal EN2 are provided with OFF level signals, i.e., low-level signals. Since the first control signal terminal EN1 and the second control signal terminal EN2 are at a low level, both the eighth switch transistor M8 and the ninth switch transistor M9 are turned off. The tenth switch transistor M10 and the eleventh switch transistor M11 are turned on alternately under the alternate control of the third control signal terminal EN3 and the fourth control signal terminal EN4, and at this time, the low-level signal terminal VGL can transmit the signal to the gate of the twelfth switch transistor M12 through the tenth switch transistor M10 or the eleventh switch transistor M11 to thereby control the twelfth switch transistor M12 to be turned off. At this time, the thirteenth switch transistor M13 and the fourteenth switch transistor M14 are turned on alternately under the alternate control of the third control signal terminal EN3 and the fourth control signal terminal EN4, and at this time, the third input signal terminal CK3 can output a signal normally through the thirteenth switch transistor M13, that is, the generated second clock signal is the signal input at the third input signal terminal CK3, or the second input signal terminal CK2 can output the signal normally through the fourteenth switch transistor M14, that is, the generated second clock signal is the signal input at the second input signal terminal CK2. Furthermore since the clock signal of the second input signal terminal CK2 is opposite in phase to the clock signal of the third input signal terminal CK3, and their phases are offset from the control clock signal by a half of a periodicity, the periodicity of the generated second clock signal is a half of the periodicity of the input signals of the second input signal terminal CK2 and the third input signal terminal CK3, i.e., the frequency of the former is doubled.

The structure of the second generation circuit 4 in the shift register has only been described above by way of an example, and optionally the structure of the second generation circuit 4 will not be limited to the structure above according to the embodiment of the disclosure, but can alternatively be another structure known to those skilled in the art, although the embodiment of the disclosure will not be limited thereto.

Figure 5:
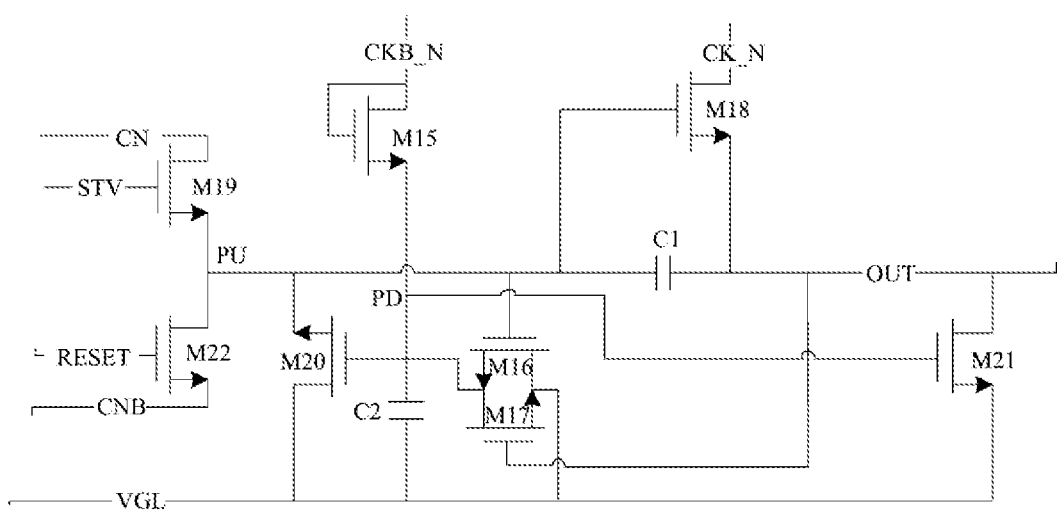
FIG. 5 is a schematic diagram of structures of an input circuit, a pull-down driver circuit, a pull-down circuit, a reset circuit, and an output circuit according to some embodiments of the disclosure.

Optionally in the shift register above according to some embodiments of the disclosure, as illustrated in FIG. 2 and FIG. 5, the pull-down driver circuit 3 includes: a fifteenth switch transistor M15, a sixteenth switch transistor M16, and a seventeenth switch transistor M17.

The fifteenth switch transistor M15 has a gate and a source connected respectively with the tenth terminal of the first generation circuit 2, and a drain connected with the second node PD.

The sixteenth switch transistor M16 has a gate connected with the first node PU, a source connected with the low-level signal terminal VGL, and a drain connected with the second node PD.

The seventeenth switch transistor M17 has a gate connected with the signal output terminal OUT, a source connected with the low-level signal terminal VGL, and a drain connected with the second node PD.

Specifically the fifteenth switch transistor M15 is turned on under the control of the first clock signal input terminal CKB_N, the second clock signal is transmitted to the second node PD through the fifteenth switch transistor M15; the sixteenth switch transistor M16 is turned on under the control of the first node PU, and the low-level signal terminal VGL transmits the signal to the second node PD through the sixteenth switch transistor M16; and the seventeenth switch transistor M17 is turned on under the control of the signal output terminal OUT, and the low-level signal terminal VGL transmits the signal to the second node PD through the seventeenth switch transistor M17.

The structure of the pull-down driver circuit 3 in the shift register has only been described above by way of an example, and optionally the structure of the pull-down driver circuit 3 will not be limited to the structure above according to the embodiments of the disclosure, but can alternatively be another structure known to those skilled in the art, although the embodiment of the disclosure will not be limited thereto.

Optionally in the shift register above according to some embodiments of the disclosure, as illustrated in FIG. 2 and FIG. 5, the output circuit 5 includes: an eighteenth switch transistor M18 and a first capacitor C1.

The eighteenth switch transistor M18 has a gate connected with the first node PU, a source connected with the tenth terminal of the second generation circuit 4, and a drain connected with the signal output terminal OUT.

The first capacitor C1 is connected between the first node PU and the signal output terminal OUT.

Specifically the eighteenth switch transistor M18 is turned on under the control of the first node PU, and the second signal input CK_N transmits the second clock signal to the signal output terminal OUT through the eighteenth switch transistor M18 to thereby control the potential of the signal output terminal OUT.

The structure of the output circuit 5 in the shift register has only been described above by way of an example, and optionally the structure of the output circuit 5 will not be limited to the structure above according to the embodiment of the disclosure, but can alternatively be another structure known to those skilled in the art, although the embodiment of the disclosure will not be limited thereto.

Optionally in the shift register above according to some embodiments of the disclosure, as illustrated in FIG. 2 and FIG. 5, the input circuit 1 includes: a nineteenth switch transistor M19.

The nineteenth switch transistor M19 has a gate connected with the signal input terminal STV, a source connected with the first level signal terminal CN, and a drain connected with the first node PU.

Specifically the nineteenth switch transistor M19 is turned on under the control of the signal input terminal STV, and the first level signal terminal CN transmits a level signal to the first node PU through the nineteenth switch transistor M19 to thereby control the potential of the first node PU.

The structure of the input circuit 1 in the shift register has only been described above by way of an example, and optionally the structure of the input circuit 1 will not be limited to the structure above according to the embodiment of the disclosure, but can alternatively be another structure known to those skilled in the art, although the embodiment of the disclosure will not be limited thereto.

Optionally in the shift register above according to some embodiments of the disclosure, as illustrated in FIG. 2 and FIG. 5, the pull-down circuit 6 includes: a twentieth switch transistor M20, a twenty-first switch transistor M21, and a second capacitor C2.

The twentieth switch transistor M20 has a gate connected with the second node PD, a source connected with the low-level signal terminal VGL, and a drain connected with the first node PU.

The twenty-first switch transistor M21 has a gate connected with the second node PD, a source connected with the low-level signal terminal VGL, and a drain connected with the signal output terminal OUT.

The second capacitor is connected between the second node PD and the low-level signal terminal VGL.

Specifically the twentieth switch transistor M20 and the twenty-first switch transistor M21 are turned on under the control of the second node PD, and the low-level signal terminal VGL transmits the signal respectively to the first node PU and the signal output terminal OUT through the twentieth switch transistor M20 and the twenty-first switch transistor M21 to thereby control the potentials of the first node PU and the signal output terminal OUT.

Optionally in the shift register above according to some embodiments of the disclosure, as illustrated in FIG. 2 and FIG. 5, the reset circuit 7 can particularly include: a twenty-second switch transistor M22.

The twenty-second switch transistor M22 has a gate connected with the reset signal terminal RESET, a source connected with the second level signal terminal CNB, and a drain connected with the first node PU.

Specifically the twenty-second switch transistor M22 is turned on under the control of the reset signal terminal RESET, and the second level signal terminal CNB transmits the level signal to the first node PU through the twenty-second switch transistor M22 to thereby control the potential of the first node PU.

It shall be noted that the switch transistors in the embodiment of the disclosure can be Thin Film Transistors (TFTs), or can be Metal Oxide Semiconductor Field Effect Transistors (MOSFETs), although the embodiment of the disclosure will not be limited thereto. In an implementation, the sources and the drains of these switch transistors can be functionally replaced with each other dependent upon their different transistor types and input signals, so the sources and the drains may not be distinguished here from each other.

Figure 6:
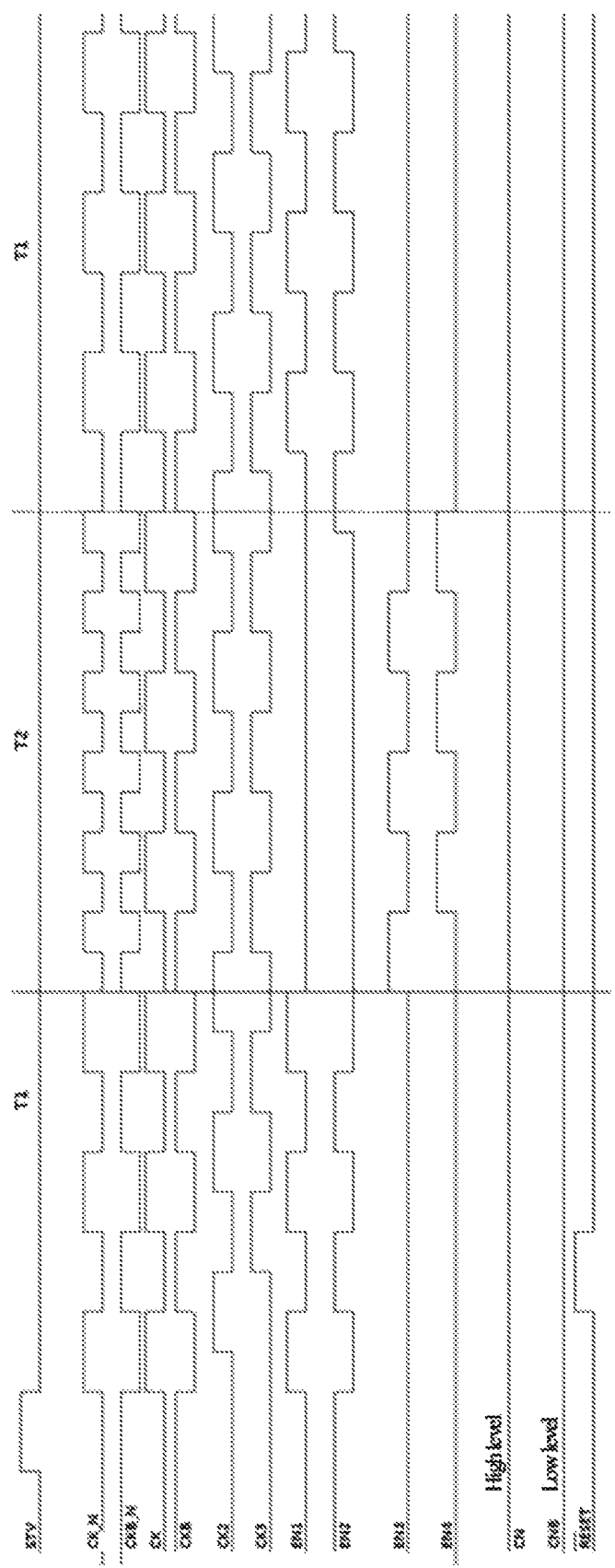
FIG. 6 is a timing diagram of the shift register operating at different resolutions according to some embodiments of the disclosure.

Based upon the same inventive idea, an embodiment of the disclosure further provides a method for driving the shift register above, and as illustrated in FIG. 6, the method includes the following.

No matter whether the shift register is operating at a time period T1 at a lower resolution (in a low-power-consumption period) or a time period T2 at a higher resolution (in a high-definition display mode), the first input signal terminal CKB and the fourth input signal terminal CK are provided with the clock signals with opposite phases; and the second input signal terminal CK2 and the third input signal terminal CK3 are provided with clock signals with opposite phases, where the clock signal of the second input signal terminal CK2 is offset from the clock signal of the first input signal terminal CKB by a half of a periodicity, and the input signal of the third input signal terminal CK3 is offset from the clock signal of the fourth input signal terminal CK by a half of the periodicity.

In the time period T1 at a first resolution, that is, when the shift register is operating at the lower resolution (in the low-power-consumption period), the first control signal terminal EN1 and the second control signal terminal EN2 are provided with control clock signals with opposite phases, and the third control signal terminal EN3 and the fourth control signal terminal EN4 are provided with OFF level signals. The first control signal terminal EN1 and the second control signal terminal EN2 are enabled alternately, that is, when the first control signal terminal EN1 is at a high level, the second control signal terminal EN2 is at a low level, or when the first control signal terminal EN1 is at a low level, the second control signal terminal EN2 is at a high level, and at this time, the third control signal terminal EN3 and the fourth control signal terminal EN4 remain at the OFF level, that is, when all the switch transistors in the shift register are N-type switch transistors, the Off level is a low level. Furthermore the control clock signals have the same periodicity as the clock signal of the first input signal terminal CKB.

In the time period T2 at a second resolution, the second resolution is twice the first resolution, that is, when the shift register is operating at the higher resolution (in the high-definition display mode), the third control signal terminal EN3 and the fourth control signal terminal EN4 are provided with control clock signals with opposite phases, and the first control signal terminal EN1 and the second control signal terminal EN2 are provided with Off level signals. The third control signal terminal EN3 and the fourth control signal terminal EN4 are enabled alternately, that is when the third control signal terminal EN3 is at a high level, the fourth control signal terminal EN4 is at a low level, or when the third control signal terminal EN3 is at a low level, the fourth control signal terminal EN4 is at a high level, and at this time, the first control signal terminal EN1 and the second control signal terminal EN2 remain at an Off level, that is, when all the switch transistors in the shift register are N-type switch transistors, the Off level can be a low level.

Specifically the first clock signal and the second clock signal generated in the shift register above according to the embodiment of the disclosure are clock signals of a shift register GOA logic circuit consisted of the fifteenth switch transistor M15, the sixteenth switch transistor M16, the seventeenth switch transistor M17, the eighteenth switch transistor M18, the nineteenth switch transistor M19, the twentieth switch transistor M20, the twenty-first switch transistor M21, and the twenty-second switch transistor M22. When the shift register operating at the higher resolution (in the high-definition display mode), the frequencies of the generated first clock signal and second clock signal are twice the frequencies of the input signals of the second input signal terminal CK2 and the third input signal terminal CK3, so that the charging time is changed to a half thereof to thereby adjust the resolution to a double thereof, thus enabling the high-definition display function; or when the shift register is operating at the lower resolution (in the low-power-consumption period), the frequencies of the generated first clock signal and second clock signal remain the same as the frequencies of the input signals of the first input signal terminal CKB and the fourth input signal terminal CK, thus enabling the low-power-consumption display mode.

An operating process of the shift register above according to some embodiments of the disclosure will be described below taking N-type transistors as an example. In the following description, 1 represents a high level, and 0 represents a low level.

Specifically taking the structure of the shift register as illustrated in FIG. 2 as an example, an instance in which it is operating at a lower resolution, and an instance in which it is operating at a higher resolution (i.e., in the high-definition display mode) will be described respectively by way of an example. In the shift register as illustrated in FIG. 2, all the switch transistors are N-type transistors, and the respective N-type switch transistors are turned on at a high level, and turned off at a low level; and a valid pulse signal of the signal input terminal STV is a high-level signal.

(I) When the Shift Register is Operating at a Lower Resolution.

Figure 7:
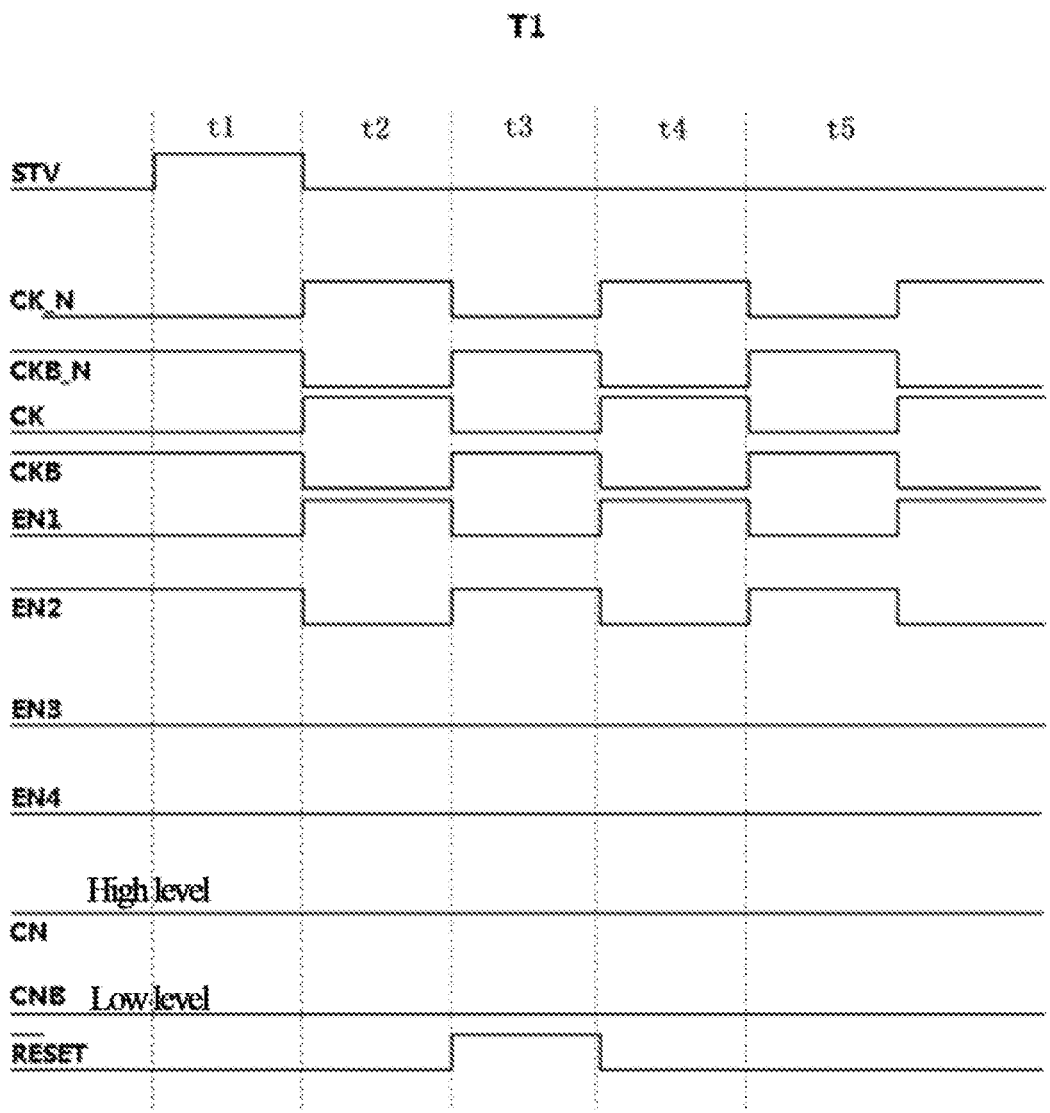
FIG. 7 is a timing diagram of the shift register operating at a lower resolution according to some embodiments of the disclosure.

The signals input at the first input signal terminal CKB and the fourth input signal terminal CK are clock signals with opposite phases, the signals input at the second input signal terminal CK2 and the third input signal terminal CK3 are clock signals with opposite phases, the signal input at the third input signal terminal CK3 is offset from the signal input at the fourth input signal terminal CK4 by a half of the periodicity, and the signal input at the second input signal terminal CK2 is offset from the signal input at the first input signal terminal CKB by a half of the periodicity; the first level signal terminal CN is at a high level, and the second level signal terminal CKB is at a low level; and the first control signal terminal EN1 and the second control signal terminal EN2 are enabled alternately, the third control signal terminal EN3 and the fourth control signal terminal EN4 remain at a low level, and the corresponding input-output timing diagram is T1 period shown in FIG. 6 and FIG. 7. The T1 period includes five sub-periods which are a first sub-period t1, a second sub-period t2, a third sub-period t3, a fourth sub-period t4, and a fifth sub-period t5.

In the first sub-period t1, STV=1, RESET=0, CN=1, CNB=0, EN1=0, EN2=1, EN3=0, EN4=0, CK=0, and CKB=1.

With EN2 being a high level, the second switch transistor M2 is turned on, the signal of the high-level signal terminal VGH is transmitted to the gate of the fifth switch transistor M5 through the second switch transistor M2, the fifth switch transistor M5 is turned on, the signal input at the first input signal terminal CKB is output to the first clock signal input terminal CKB_N through the fifth switch transistor M5, and at this time, the frequency of the first clock signal input at the first clock signal input terminal CKB_N is the same as the frequency of the signal input at the first input signal terminal CKB, so the first clock signal is at a high level. Alike with EN2 being the high level, the ninth switch transistor M9 is turned on, the signal of the high-level signal terminal VGH is transmitted to the gate of the twelfth switch transistor M12 through the ninth switch transistor M9, the twelfth switch transistor M2 is turned on, the signal input at the fourth input signal terminal CK is output to the second clock signal input terminal CK_N through the twelfth switch transistor M12, and at this time, the frequency input at the second clock signal input terminal CK_N is the same as the frequency of the signal input at the fourth input signal terminal CK, so the second clock signal is at a low level.

With RESET being a low level, the twenty-second switch transistor M22 is turned off; with STV being a high level, the nineteenth switch transistor M19 is turned on, the signal input at CN is transmitted to the first node PU through the nineteenth switch transistor M19, the potential of the first node PU is a high level, the capacitor C1 is charged, and the sixteenth switch transistor M16 and the eighteenth switch transistor M18 are turned on. With the first clock signal being at a high level, the capacitor C2 is charged; the sixteenth switch transistor M16 is turned on so that the second node PD is connected with the low-level signal terminal VGL, the potential of the second node PD is a low level, and the twentieth switch transistor M20 and the twenty-first switch transistor M21 are turned off; and the second clock signal is transmitted to the signal output terminal OUT through the eighteenth switch transistor M18, and the potential of the signal output terminal OUT is at a low level. The first sub-period is a sub-period in which C1 and C2 in the shift register are charged.

In the second sub-period t2, STV=0, RESET=0, CN=1, CNB=0, EN1=1, EN2=0, EN3=0, EN4=0, CK=1, and CKB=0.

With EN1 being a high level, the first switch transistor M1 is turned on, and at this time, the signal of the high-level signal terminal VGH is transmitted to the gate of the fifth switch transistor M5 through the first switch transistor M1, the fifth switch transistor M5 is turned on, the signal input at the first input signal terminal CKB is output to the first clock signal input terminal CKB_N through the fifth switch transistor M5, and at this time, the frequency of the first clock signal input at the first clock signal input terminal CKB_N is the same as the frequency of the signal input at the first input signal terminal CKB, so the first clock signal is at a low level. Alike with EN1 being a high level, the eighth switch transistor M8 is turned on, the signal of the high-level signal terminal VGH is transmitted to the gate of the twelfth switch transistor M12 through the eighth switch transistor M8, the twelfth switch transistor M12 is turned on, the signal input at the fourth input signal terminal CK is output to the second clock signal input terminal CK_N through the twelfth switch transistor M12, and at this time, the frequency of the second clock signal input at the second clock signal input terminal CK_N is the same as the signal input at the fourth input signal terminal CK, so the second clock signal is at a high level.

With RESET remaining the low level, the twenty-second switch transistor M22 remains turned off; with STV being changed to a low level, the nineteenth switch transistor M19 is changed to be turned off; the potential of the first node PU is further pulled up due to the bootstrapping of capacitor C1, and the sixteenth switch transistor M16 and the eighteenth switch transistor M18 remain turned on; the signal of the low-level signal terminal VGL is transmitted to the second node PD through the sixteenth switch transistor M16, the potential of the second node PD is a low level, and the twentieth switch transistor M20 and the twenty-first switch transistor M21 remain turned off; and the second clock signal is transmitted to the signal output terminal OUT through the eighteenth switch transistor M18, and the potential of the signal output terminal OUT is changed to a high level, so that the gate line is completely enabled and charged. In general cases the time period when the gate line is enabled is equal to the time period when the fourth input signal terminal CK is at a high level, and since this mode is a low-power-consumption mode, the gate line is enabled for a longer time period than in the high-definition display mode.

In the third sub-period t3, STV=0, RESET=1, CN=1, CNB=0, EN1=0, EN2=1, EN3=0, EN4=0, CK=0, and CKB=1.

Like the first sub-period t1, with EN2 being a high level, the second switch transistor M2 is turned on, the signal of the high-level signal terminal VGH is transmitted to the gate of the fifth switch transistor M5 through the second switch transistor M2, the fifth switch transistor M5 is turned on, the signal input at the first input signal terminal CKB is output to the first clock signal input terminal CKB_N through the fifth switch transistor M5, and at this time, the frequency of the first clock signal input at the first clock signal input terminal CKB_N is the same as the frequency of the signal input at the first input signal terminal CKB, so the first clock signal is at a high level. Alike with EN2 being a high level, the ninth switch transistor M9 is turned on, the signal of the high-level signal terminal VGH is transmitted to the gate of the twelfth switch transistor M12 through the ninth switch transistor M9, the twelfth switch transistor M12 is turned on, the signal input at the fourth input signal terminal CK is output to the second clock signal input terminal CK_N through the twelfth switch transistor M12, and at this time, the frequency of the second clock signal input at the second clock signal input terminal CK_N is the same as the frequency of the signal input at the fourth input signal terminal CK, so the second clock signal is at a low level.

With RESET being changed to a high level, the twenty-second switch transistor M22 is turned on, and with the second level signal terminal CNB being at a low level, the potential of the first node PU is changed to a low level, the capacitor C1 is discharged, and the sixteenth switch transistor M16, the seventeenth switch transistor M17, and the eighteenth switch transistor M18 are turned off; with STV remaining at a low level, the nineteenth switch transistor M19 remains turned off; and with the first clock signal being at a high level, the fifteenth switch transistor M15 is changed to be turned on, the potential of the second node PD is changed to a high level, the second node PD controls the twentieth switch transistor M20 and the twenty-first switch transistor M21 to be turned on, and the signal of the low-level signal terminal VGL is transmitted to the first node PU through the twentieth switch transistor M20 so that the potential of the first node PU is a low level, and the signal of the level signal terminal VGL is transmitted to the signal output terminal OUT through the twenty-first switch transistor M21, so that the potential of the signal output terminal OUT is changed to a low level, thus disabling the gate line timely.

In the fourth sub-period t4, STV=0, RESET=0, CN=1, CNB=0, EN1=1, EN2=0, EN3=0, EN4=0, CK=1, and CKB=0.

Like the second sub-period t2, with EN1 being a high level, the first switch transistor M1 is turned on, and at this time, the signal of the high-level signal terminal VGH is transmitted to the gate of the fifth switch transistor M5 through the first switch transistor M1, the fifth switch transistor M5 is turned on, the signal input at the first input signal terminal CKB is output to the first clock signal input terminal CKB_N through the fifth switch transistor M5, and at this time, the frequency of the first clock signal input at the first clock signal input terminal CKB_N is the same as the frequency of the signal input at the first input signal terminal CKB, so the first clock signal is at a low level. Alike with EN1 being a high level, the eighth switch transistor M8 is turned on, the signal of the high-level signal terminal VGH is transmitted to the gate of the twelfth switch transistor M12 through the eighth switch transistor M8, the twelfth switch transistor M12 is turned on, the signal input at the fourth input signal terminal CK is output to the second clock signal input terminal CK_N through the twelfth switch transistor M12, and at this time, the frequency of the second clock signal input at the second clock signal input terminal CK_N is the same as the frequency of the signal input at the fourth input signal terminal CK, so the second clock signal is at a high level.

With RESET being changed to a low level, the twenty-second switch transistor M22 is changed to be turned off; with STV remaining at a low level, the nineteenth switch transistor M19 remains turned off, the potential of the second node PD remains at a high level, the second node PD controls the twentieth switch transistor M20 and the twenty-first switch transistor M21 to remain turned on, so that the potential of the first node PU remains at a low level, and the potential of the signal output terminal Output remains at a low level.

In the fifth sub-period t5, STV=0, RESET=1, CN=1, CNB=0, EN1=0, EN2=1, EN3=0, EN4=0, CK=0, and CKB=1.

Like the first sub-period t1, with EN2 being a high level, the second switch transistor M2 is turned on, the signal of the high-level signal terminal VGH is transmitted to the gate of the fifth switch transistor M5 through the second switch transistor M2, the fifth switch transistor M5 is turned on, the signal input at the first input signal terminal CKB is output to the first clock signal input terminal CKB_N through the fifth switch transistor M5, and at this time, the frequency of the first clock signal input at the first clock signal input terminal CKB_N is the same as the frequency of the signal input at the first input signal terminal CKB, so the first clock signal is at a high level. Alike with EN2 being a high level, the ninth switch transistor M9 is turned on, the signal of the high-level signal terminal VGH is transmitted to the gate of the twelfth switch transistor M12 through the ninth switch transistor M9, the twelfth switch transistor M12 is turned on, the signal input at the fourth input signal terminal CK is output to the second clock signal input terminal CK_N through the twelfth switch transistor M12, and at this time, the frequency of the second clock signal input at the second clock signal input terminal CK_N is the same as the frequency of the signal input at the fourth input signal terminal CK, so the second clock signal is at a low level.

With RESET remaining at a low level, the twenty-second switch transistor M22 remains turned off; with STV remaining at a low level, the nineteenth switch transistor M19 remains turned off; and the potential of the second node PD remains at a high level, and the second node PD controls the twentieth switch transistor M20 and the twenty-first switch transistor M21 to remain turned on, so that the potential of the first node PU remains at a low level, and the potential of the signal output terminal OUT remains at a low level.

Thereafter the shift register repeats the operating states in the fourth and fifth sub-periods above until the shift register starts displaying in a high-definition mode, or receives an input signal of the next frame.

It shall be noted that since EN3 and EN4 remain at a low level, all of the third switch transistor M3, the fourth switch transistor M4, the sixth switch transistor M6, the seventh switch transistor M7, the tenth switch transistor M10, the eleventh switch transistor M11, the thirteenth switch transistor M13, and the fourteenth switch transistor M14 are turned off, and the second input signal terminal CK2 and the third input signal terminal CK3 have no effect on the operating of the shift register.

(II) When the Shift Register is Displaying in a High-Definition Mode.

Figure 8:
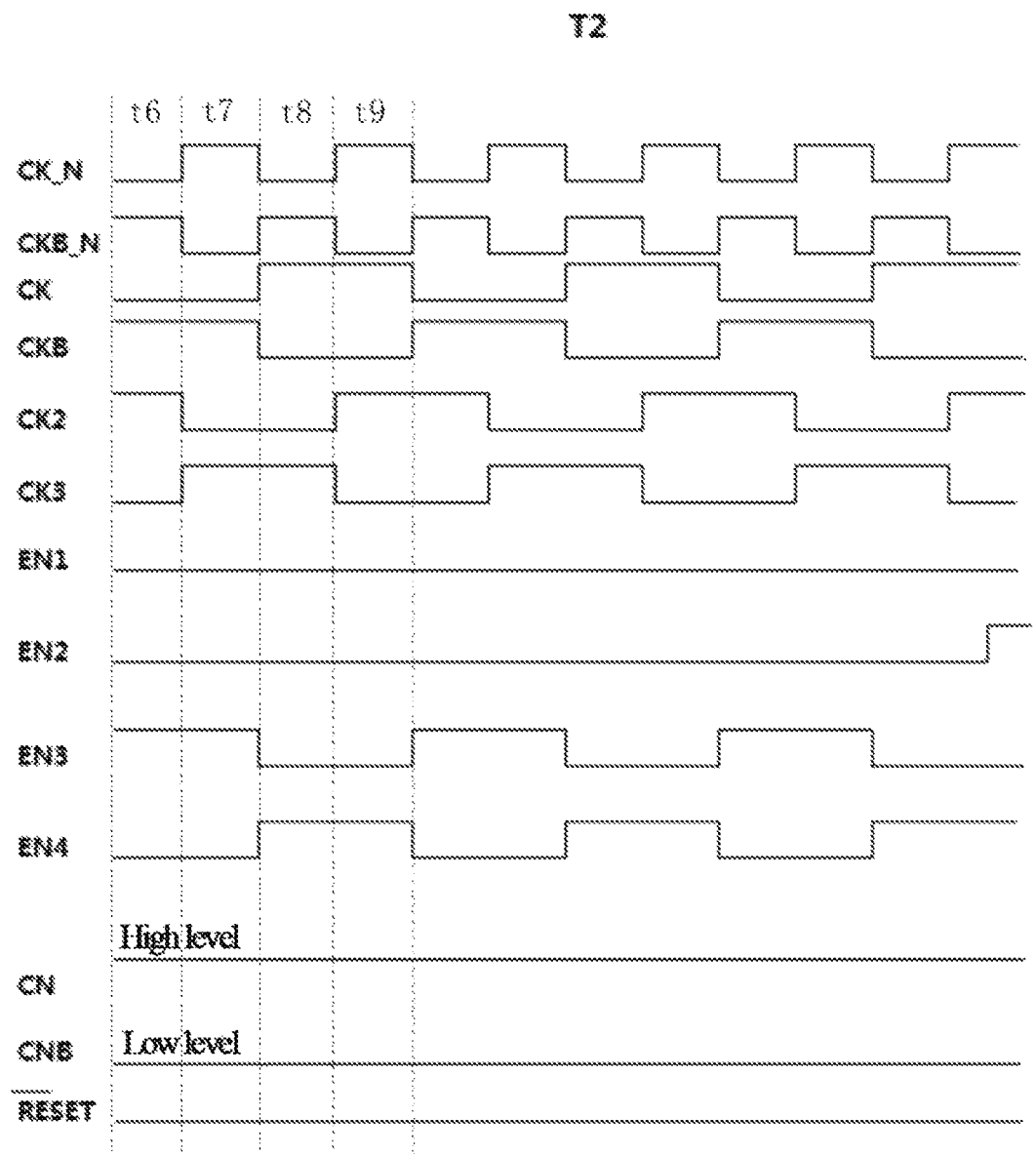
FIG. 8 is a timing diagram of the shift register operating at a higher resolution according to some embodiments of the disclosure.

The signal input at the first input signal terminal CKB and the signal input at the fourth input signal terminal CK are clock signals with opposite phases, the signal input at the second input signal terminal CK2 and the signal input at the third input signal terminal CK3 are clock signals with opposite phases, the input signal of the third input signal terminal CK3 is offset from the input signal of the fourth input signal terminal CK4 by a half of the periodicity, and the input signal of the second input signal terminal CK2 is offset from the input signal of the first input signal terminal CKB by a half of the periodicity; the first level signal terminal CN is at a high level, and the second level signal terminal CNB is at a low level; and the third control signal terminal EN3 and the fourth control signal terminal EN4 are enabled alternately, the first control signal terminal EN1 and the second control signal terminal EN2 remain at a low level, and the corresponding input-output timing diagram is T2 period shown in FIG. 6 and FIG. 8. The T2 period includes four sub-periods which are a sixth sub-period t6, a seventh sub-period t7, an eighth sub-period t8, and a ninth sub-period t9, where the time lengths of t6, t7, t8, and t9 are a half of the time lengths of t1, t2, t3, and t4 respectively.

In the sixth sub-period t6, CN=1, CNB=0, EN1=0, EN2=0, EN3=1, EN4=0, CK2=1, CK3=0, CK=0, and CKB=1.

With EN3 being a high level, the third switch transistor M3 and the sixth switch transistor M6 are turned on, the signal of the low-level signal terminal VGL is transmitted to the gate of the fifth switch transistor M5 through the third switch transistor M3, the fifth switch transistor M5 remains turned off, the signal input at the second input signal terminal CK2 is transmitted to the first clock signal input terminal CKB_N through the sixth switch transistor M6, and at this time, the frequency of the first clock signal input at the first clock signal input terminal CKB_N is the same as the frequency of the signal input at the second input signal terminal CK2, so the first clock signal is at a high level.

Alike with EN3 being a high level, the tenth switch transistor M10 and the thirteenth switch transistor M13 are turned on, the signal of the low-level signal terminal VGL is transmitted to the gate of the twelfth switch transistor M12 through the tenth switch transistor M10, the twelfth switch transistor M12 remains turned off, the signal input at the third input signal terminal CK3 is transmitted to the second clock signal input terminal CK_N through the thirteenth switch transistor M13, and at this time, the frequency of the second clock signal input at the second clock signal input terminal CK_N is the same as the frequency of the signal input at the third input signal terminal CK3, so the second clock signal is at a low level.

In the seventh sub-period t7, CN=1, CNB=0, EN1=0, EN2=0, EN3=1, EN4=0, CK2=0, CK3=1, CK=0, and CKB=1.

With EN3 being a high level, the third switch transistor M3 and the sixth switch transistor M6 are turned on, the signal of the low-level signal terminal VGL is transmitted to the gate of the fifth switch transistor M5 through the third switch transistor M3, the fifth switch transistor M5 remains turned off, the input signal of the second input signal terminal CK2 is transmitted to the first clock signal input terminal CKB_N through the sixth switch transistor M6, and at this time, the frequency of the first clock signal input at the first clock signal input terminal CKB_N is the same as the frequency of the input signal of the second input signal terminal CK2, so the first clock signal is at a low level. Alike with EN3 being a high level, the tenth switch transistor M10 and the thirteenth switch transistor M13 are turned on, the signal of the low-level signal terminal VGL is transmitted to the gate of the twelfth switch transistor M12 through the tenth switch transistor M10, the twelfth switch transistor M12 remains turned off, the signal input at the third input signal terminal CK3 is transmitted to the second clock signal input terminal CK_N through the thirteenth switch transistor M13, and at this time, the frequency of the second clock signal input at the second clock signal input terminal CK_N is the same as the frequency of the signal input at the third input signal terminal CK3, so the second clock signal is at a high level.

In the eighth sub-period t8, CN=1, CNB=0, EN1=0, EN2=0, EN3=0, EN4=1, CK2=0, CK3=1, CK=0, and CKB=1.

With EN4 being a high level, the fourth switch transistor M4 and the seventh switch transistor M7 are turned on, the signal of the low-level signal terminal VGL is transmitted to the gate of the fifth switch transistor M5 through the fourth switch transistor M4, the fifth switch transistor M5 remains turned off, the signal input at the third input signal terminal CK3 is transmitted to the first clock signal input terminal CKB_N through the seventh switch transistor M7, and at this time, the frequency of the first clock signal input at the first clock signal input terminal CKB_N is the same as the frequency of the signal input at the third input signal terminal CK3, so the first clock signal is at a high level. Alike with EN4 being a high level, the eleventh switch transistor M11 and the fourteenth switch transistor M14 are turned on, the signal of the low-level signal terminal VGL is transmitted to the gate of the twelfth switch transistor M12 through the eleventh switch transistor M11, the twelfth switch transistor M12 remains turned off, the signal input at the second input signal terminal CK2 is transmitted to the second clock signal input terminal CK_N through the fourteenth switch transistor M14, and at this time, the frequency of the second clock signal input at the second clock signal input terminal CK_N is the same as the frequency of the signal input at the second input signal terminal CK2, so the second clock signal is at a low level.

In the ninth sub-period t9, CN=1, CNB=0, EN1=0, EN2=0, EN3=0, EN4=1, CK2=1, CK3=0, CK=0, and CKB=1.

With EN4 being a high level, the fourth switch transistor M4 and the seventh 7 are turned on, the signal of the low-level signal terminal VGL is transmitted to the gate of the fifth switch transistor M5 through the fourth switch transistor M4, the fifth switch transistor M5 remains turned off, the signal input at the third input signal terminal CK3 is transmitted to the first clock signal input terminal CKB_N through the seventh switch transistor M7, and at this time, the frequency of the first clock signal input at the first clock signal input terminal CKB_N is the same as the frequency of the signal input at the third input signal terminal CK3, so the first clock signal is at a low level. Alike with EN4 being a high level, the eleventh switch transistor M11 and the fourteenth switch transistor M14 are turned on, the signal of the low-level signal terminal VGL is transmitted to the gate of the twelfth switch transistor M12 through the eleventh switch transistor M11, the twelfth switch transistor M12 remains turned off, the signal input at the second input signal terminal CK2 is transmitted to the second clock signal input terminal CK_N through the fourteenth switch transistor M14, and at this time, the frequency of the second clock signal input at the second clock signal input terminal CK_N is the same as the frequency of the signal input at the second input signal terminal CK2, so the second clock signal is at a high level.

Thereafter the shift register repeats the operating states in the four sub-periods above until the shift register starts displaying at a lower resolution, or receives an input signal of the next frame.

Figure 9:
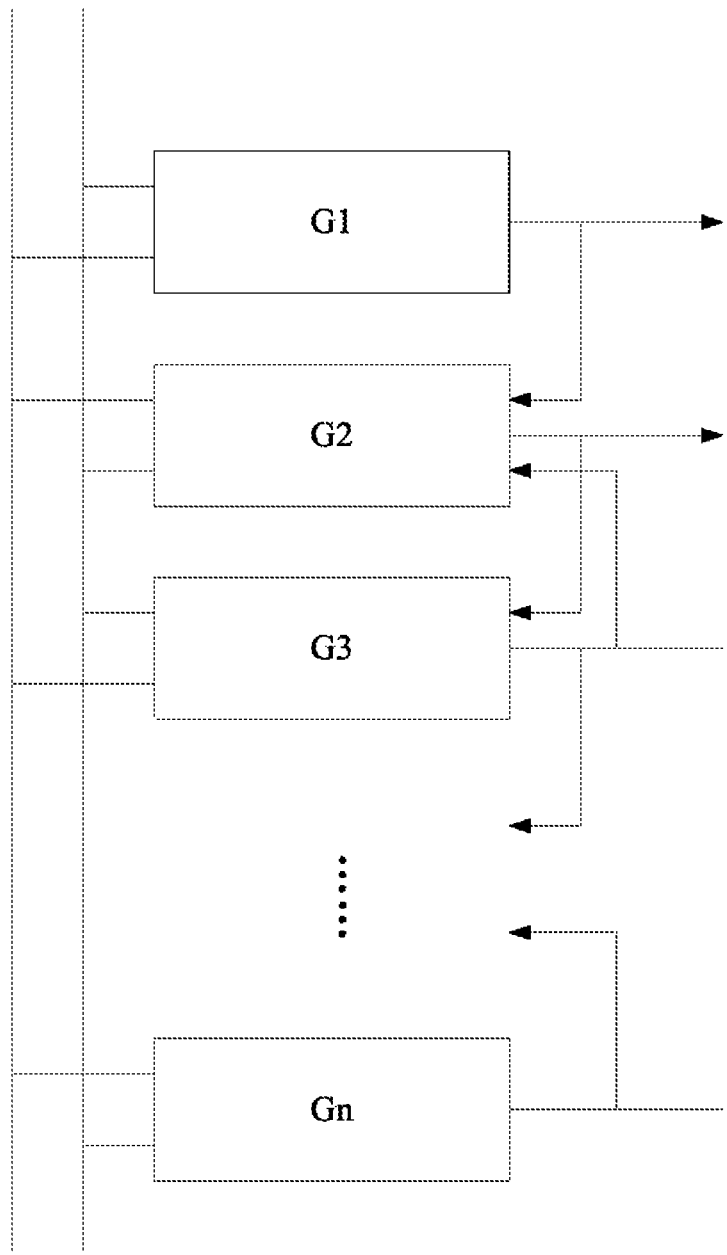
FIG. 9 is a schematic structural diagram of a gate line integrated driver circuit according to some embodiments of the disclosure.

Based upon the same inventive idea, an embodiment of the disclosure further provides a gate line integrated driver circuit. As illustrated in FIG. 9, the gate line integrated driver circuit includes a plurality of cascaded shift registers G1, G2, G3, . . . , Gn. Each of the shift registers other than the first shift register G1 and the last shift register Gn inputs a trigger signal to the signal input terminal of a succeeding shift register adjacent thereto, and inputs a reset signal to the reset signal terminal of a preceding shift register adjacent thereto; the first shift register G1 inputs a trigger signal to the signal input terminal of the second shift register G2; and the last shift register Gn inputs a reset signal to the reset signal terminals of itself and the preceding shift register.

Specifically a structure of each shift register in the gate line integrated driver circuit above can be functionally and structurally identical to the shift register above according to the embodiment of the disclosure, so a repeated description thereof will be omitted here.

Figure 10:
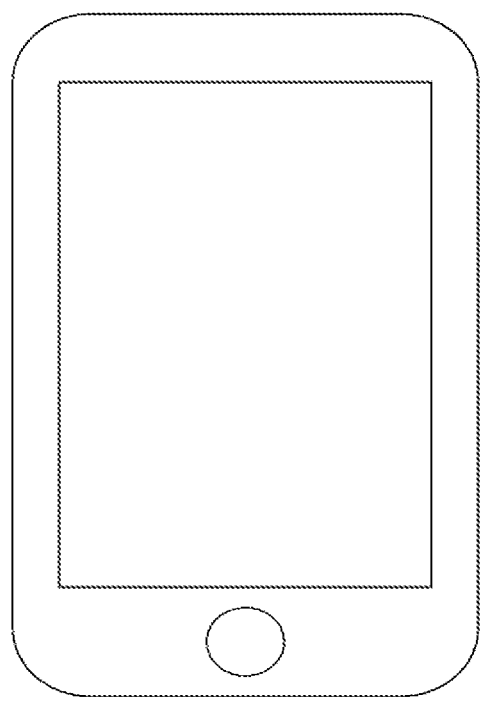
FIG. 10 is a schematic structural diagram of a display device according to some embodiments of the disclosure.

Based upon the same inventive idea, an embodiment of the disclosure further provides a display device. As illustrated in FIG. 10, the display device includes the gate line integrated driver circuit above, and reference can be made to the description of the gate line integrated driver circuit above for an implementation of the display device, so a repeated description thereof will be omitted here. The display device can be a mobile phone, a tablet computer, a TV set, a monitor, a notebook computer, a digital photo frame, a navigator, or any other product or component with a display function. All of the other components indispensable to the display device shall readily occur to those ordinarily skilled in the art, so a repeated description thereof will be omitted here, and the disclosure will not be limited thereto. Reference can be made to the embodiments of the shift register and the gate line integrated driver circuit above for an implementation of the display device, so a repeated description thereof will be omitted here.

Some embodiments of the disclosure provide a shift register, a method for driving the same, a gate line integrated driver circuit, and a display device, where a first generation circuit generates and provides a first clock signal to a shift register logic circuit; a second generation circuit generates and provides a second clock signal to the shift register logic circuit; and under the control of a first control signal terminal, a second control signal terminal, a third control signal terminal, and a fourth control signal terminal, the first clock signal and the second clock signal are clock signals with opposite phases, and the clock signals can have different frequencies in different time periods. When the display panel is displaying, the first generation circuit and the second generation circuit generate the clock signals at the different frequencies, so that the clock signals with the different frequencies are switched at any time, and thus the display panel is switched between different resolutions at any time, to enabling an intelligent display function. The display panel can be switched at will between the high-definition display and low-power-consumption modes to thereby satisfy a visual demand, and lower effectively power consumption.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A shift register, comprising: a shift register logic circuit, a first generation circuit, and a second generation circuit, wherein:
the first generation circuit has a first terminal connected with a first control signal terminal, a second terminal connected with a second control signal terminal, a third terminal connected with a third control signal terminal, a fourth terminal connected with a fourth control signal terminal, a fifth terminal connected with a low-level signal terminal, a sixth terminal connected with a high-level signal terminal, a seventh terminal connected with a first input signal terminal, an eighth terminal connected with a second input signal terminal, a ninth terminal connected with a third input signal terminal, and a tenth terminal, which is an output terminal, connected with a first clock signal input terminal of the shift register logic circuit; and the first generation circuit is configured to generate and output a first clock signal under the control of the first control signal terminal, the second control signal terminal, the third control signal terminal, and the fourth control signal terminal;
the second generation circuit has a first terminal connected with the first control signal terminal, a second terminal connected with the second control signal terminal, a third terminal connected with the third control signal terminal, a fourth terminal connected with the fourth control signal terminal, a fifth terminal connected with the low-level signal terminal, a sixth terminal connected with the high-level signal terminal, a seventh terminal connected with the second input signal terminal, an eighth terminal connected with the third input signal terminal, a ninth terminal connected with a fourth input signal terminal, and a tenth terminal, which is an output terminal, connected with a second clock signal input terminal of the shift register logic circuit; and the second generation circuit is configured to generate and output a second clock signal under the control of the first control signal terminal, the second control signal terminal, the third control signal terminal, and the fourth control signal terminal; and
the first clock signal and the second clock signal are clock signals with opposite phases, and the clock signals are configured to be provided with different frequencies in different time periods.

2. The shift register according to claim 1, wherein the first generation circuit comprises: a first switch transistor, a second switch transistor, a third switch transistor, a fourth switch transistor, a fifth switch transistor, a sixth switch transistor, and a seventh switch transistor, wherein:
the first switch transistor has a gate connected with the first control signal terminal, a source connected with the high-level signal terminal, and a drain connected with a gate of the fifth switch transistor;
the second switch transistor has a gate connected with the second control signal terminal, a source connected with the high-level signal terminal, and a drain connected with the gate of the fifth switch transistor;
the third switch transistor has a gate connected with the third control signal terminal, a source connected with the low-level signal terminal, and a drain connected with the gate of the fifth switch transistor;
the fourth switch transistor has a gate connected with the fourth control signal terminal, a source connected with the low-level signal terminal, and a drain connected with the gate of the fifth switch transistor;
the fifth switch transistor has a source connected with the first input signal terminal, and a drain connected with the first clock signal input terminal of the shift register logic circuit;
the sixth switch transistor has a gate connected with the third control signal terminal, a source connected with the second input signal terminal, and a drain connected with the first clock signal input terminal of the shift register logic circuit; and
the seventh switch transistor has a gate connected with the fourth control signal terminal, a source connected with the third input signal terminal, and a drain connected with the first clock signal input terminal of the shift register logic circuit.

3. The shift register according to claim 1, wherein the second generation circuit comprises: an eighth switch transistor, a ninth switch transistor, a tenth switch transistor, an eleventh switch transistor, a twelfth switch transistor, a thirteenth switch transistor, and a fourteenth switch transistor, wherein:
the eighth switch transistor has a gate connected with the first control signal terminal, a source connected with the high-level signal terminal, and a drain connected with a gate of the twelfth switch transistor;
the ninth switch transistor has a gate connected with the second control signal terminal, a source connected with the high-level signal terminal, and a drain connected with the gate of the twelfth switch transistor;
the tenth switch transistor has a gate connected with the third control signal terminal, a source connected with the low-level signal terminal, and a drain connected with the gate of the twelfth switch transistor;
the eleventh switch transistor has a gate connected with the fourth control signal terminal, a source connected with the low-level signal terminal, and a drain connected with the gate of the twelfth switch transistor;

the twelfth switch transistor has a source connected with the fourth input signal terminal, and a drain connected with the second clock signal input terminal of the shift register logic circuit;

the thirteenth switch transistor has a gate connected with the third control signal terminal, a source connected with the third input signal terminal, and a drain connected with the second clock signal input terminal of the shift register logic circuit; and the fourteenth switch transistor has a gate connected with the fourth control signal terminal, a source connected with the second input signal terminal, and a drain connected with the second clock signal input terminal of the shift register logic circuit.

4. The shift register according to claim 1, wherein the shift register logic circuit comprises: an input circuit, a pull-down drive circuit, an output circuit, a pull-down circuit, and a reset circuit, wherein:

the input circuit has a first terminal connected with a signal input terminal, a second terminal connected with a first level signal terminal, and a third terminal connected with a first node; and the input circuit is configured to control a potential of the first node under the control of the signal input terminal;

the pull-down driver circuit has a first terminal, which is the first clock signal input terminal of the shift register logic circuit, connected with the tenth terminal of the first generation circuit, a second terminal connected with the first node, a third terminal connected with the low-level signal terminal, a fourth terminal connected with a second node, and a fifth terminal connected with a signal output terminal; and the pull-down driver circuit is configured to control a potential of the second node under the control of the first clock signal input terminal, the first node, and the signal output terminal;

the output circuit has a first terminal, which is the second clock signal input terminal of the shift register logic circuit, connected with the tenth terminal of the second generation circuit, a second terminal connected with the first node, and a third terminal connected with the signal output terminal; and the output circuit is configured to output the second clock signal through the signal output terminal under the control of the first node;

the pull-down circuit has a first terminal connected with the low-level signal terminal, a second terminal connected with the first node, a third terminal connected with the second node, and a fourth terminal connected with the signal output terminal; and the pull-down circuit is configured to control the potential of the first node and a potential of the signal output terminal under the control of the second node; and the reset circuit has a first terminal connected with the first node, a second terminal connected with a second level signal terminal, and a third terminal connected with a reset signal terminal; and the reset circuit is configured to control the potential of the first node under the control of the reset signal terminal.

5. The shift register according to claim 4, wherein the pull-down driver circuit comprises: a fifteenth switch transistor, a sixteenth switch transistor, and a seventeenth switch transistor, wherein:

the fifteenth switch transistor has a gate and a source connected respectively with the tenth terminal of the first generation circuit, and a drain connected with the second node;

the sixteenth switch transistor has a gate connected with the first node, a source connected with the low-level signal terminal, and a drain connected with the second node; and the seventeenth switch transistor has a gate connected with the signal output terminal, a source connected with the low-level signal terminal, and a drain connected with the second node.

6. The shift register according to claim 4, wherein the output circuit comprises: an eighteenth switch transistor and a first capacitor, wherein:

the eighteenth switch transistor has a gate connected with the first node, a source connected with the tenth terminal of the second generation circuit, a drain connected with the signal output terminal; and the first capacitor is connected between the first node and the signal output terminal.

7. The shift register according to claim 4, wherein the input circuit comprises: a nineteenth switch transistor, wherein:

the nineteenth switch transistor has a gate connected with the signal input terminal, a source connected with the first level signal terminal, and a drain connected with the first node.

8. The shift register according to claim 4, wherein the pull-down circuit comprises: a twentieth switch transistor, a twenty-first switch transistor, and a second capacitor, wherein:

the twentieth switch transistor has a gate connected with the second node, a source connected with the low-level signal terminal, and a drain connected with the first node;

the twenty-first switch transistor has a gate connected with the second node, a source connected with the low-level signal terminal, and a drain connected with the signal output terminal; and the second capacitor is connected between the second node and the low-level signal terminal.

9. The shift register according to claim 4, wherein the reset circuit comprises: a twenty-second switch transistor, wherein:

the twenty-second switch transistor has a gate connected with the reset signal terminal, a source connected with the second level signal terminal, and a drain connected with the first node.

10. A method for driving the shift register according to claim 1, the method comprising:

providing the first input signal terminal and the fourth input signal terminal with clock signals with opposite phases, and providing the second input signal terminal and the third input signal terminal with clock signals with opposite phases, wherein the clock signal provided to the second input signal terminal is offset from the clock signal provided to the first input signal terminal by a half of a periodicity, and the clock signal provided to the third input signal terminal is offset from the clock signal provided to the fourth input signal terminal by a half of the periodicity;

in a time period at a first resolution, providing the first control signal terminal and the second control signal terminal with control clock signals with opposite phases, and providing the third control signal terminal and the fourth control signal terminal with OFF level signals; and in a time period at a second resolution, providing the third control signal terminal and the fourth control signal terminal with control clock signals with opposite phases, and providing the first control signal terminal and the second control signal terminal with OFF level signals, wherein:

the control clock signals have the same periodicity as the clock signal of the first input signal terminal; and the second resolution is twice the first resolution.

11. A gate line integrated driver circuit, comprising a plurality of cascaded shift registers according to claim 1, wherein each of the shift registers other than a first shift register and a last shift register inputs a trigger signal to the signal input terminal of a succeeding shift register adjacent thereto, and inputs a reset signal to the reset signal terminal of a preceding shift register adjacent thereto; the first shift register inputs a trigger signal to the signal input terminal of the second shift register; and the last shift register inputs a reset signal to the reset signal terminals of itself and the preceding shift register.

12. A display device, comprising the gate line integrated driver circuit according to claim 11.

* * * * *